United States Patent [19]

Miller, Sr. et al.

[11] Patent Number: 4,659,944
[45] Date of Patent: Apr. 21, 1987

[54] HIGH VOLTAGE DETECTION CIRCUIT

[75] Inventors: James A. Miller, Sr.; Robert N. Allgood; Richard W. Ulmer, all of Austin, Tex.

[73] Assignee: Motorola, Inc., Schaumburg, Ill.

[21] Appl. No.: 720,789

[22] Filed: Apr. 8, 1985

[51] Int. Cl.$^4$ ............................................. H03K 5/153
[52] U.S. Cl. .................................... 307/350; 307/354; 307/362; 307/296 R
[58] Field of Search .............. 307/350, 354, 362, 363, 307/296 R

[56] References Cited

U.S. PATENT DOCUMENTS

| | | | |
|---|---|---|---|
| 4,318,013 | 3/1982 | Thomas et al. | 307/362 |
| 4,463,270 | 7/1984 | Gordon | 307/362 |
| 4,463,271 | 7/1984 | Gill, Jr. | 307/350 |
| 4,496,855 | 1/1985 | Yamamura | 307/362 |

Primary Examiner—John Zazworsky
Attorney, Agent, or Firm—John A. Fisher; Jeffrey Van Myers; Robert L. King

[57] ABSTRACT

A voltage detecting circuit is provided for generating an output signal when an input signal exceeds the power supply voltage by a predetermined amount. A reference current is established by an output stage using a first current mirror. A second current mirror is connected to the output stage and detects the input voltage level by forcing a greater or lesser amount of current through the output stage to provide a high or low level output voltage.

6 Claims, 1 Drawing Figure

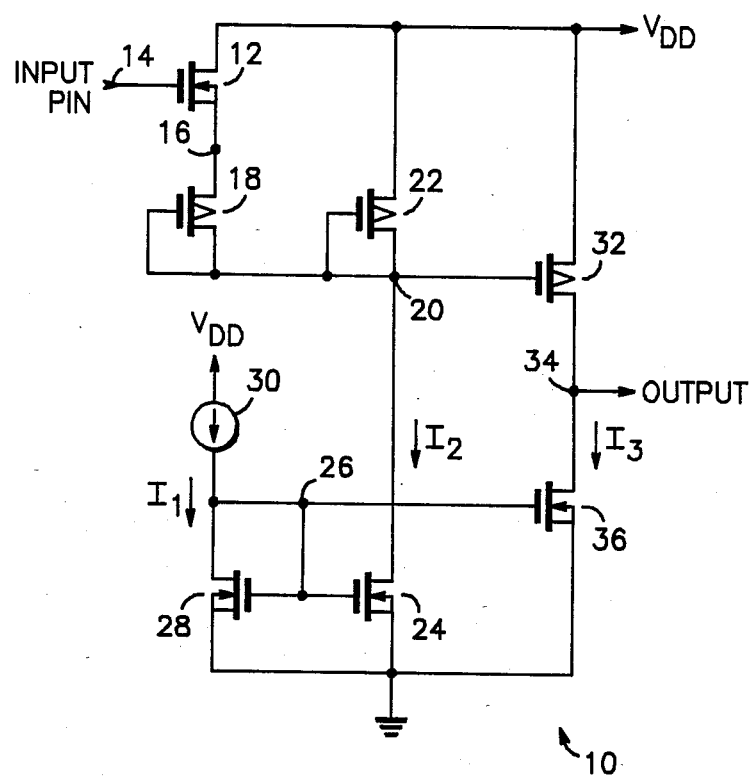

4,659,944

HIGH VOLTAGE DETECTION CIRCUIT

FIELD OF THE INVENTION

This invention relates generally to voltage detection circuits, and more particularly, to a circuit for detecting when the voltage on an input pin of an integrated circuit becomes greater than a predetermined value, such as the supply voltage to the integrated circuit.

BACKGROUND OF THE INVENTION

An important consideration in the electrical and packaging design of integrated circuits is the number of input and output pins provided for communication between the integrated circuit and external circuitry with which a circuit must operate. As a general rule, the cost of a package of an integrated circuit is directly proportional to the number of input/output (I/O) pins. Additionally, packages with larger numbers of pins usually occupy a greater area of circuit board or other mounting medium for the chip. Consequently, it is desirable to utilize circuit pins for more than one function if possible.

With the advent of very large scale integrated (VLSI) circuit devices, costs associated with testing the devices for operability and reliability represent a significant portion of manufacturing costs due to increased complexity of VLSI devices. Designers of integrated circuits can reduce testing costs by providing access to the circuitry beyond normal user access in order to directly test certain critical functions. To allow such access, some designs may include a "test mode" wherein certain features beyond typical user features can be made available to the user. Access to predetermined portions of circuitry may be provided without increasing the total pin count of the package by using a pin (or several pins) for more than one function.

A designated pin may be provided with a detection means, for example, which detects whether or not a voltage applied to the pin is outside the voltage range expected in normal use. An example of a detection circuit for providing this function is taught by James S. Thomas et al. in U.S. Pat. No. 4,318,013 entitled "High Voltage Detection Circuit". The detection of such a voltage can be used to place the circuit in a "test" mode in which the circuit may allow operations different from those allowed in the normal or "user" mode.

The detection circuit in such a device must provide an unambiguous indication of the chip mode upon the application of the appropriate voltage. In the past such circuits have had varying degrees of sensitivity to supply voltages and/or to processing variations.

SUMMARY OF THE INVENTION

Accordingly, an object of the present invention is to provide an improved voltage detection circuit.

Another object of the present invention is to provide an improved voltage detection circuit which is substantially insensitive to power supply variations.

A further object of the present invention is to provide an improved voltage detecting circuit which is substantially insensitive to processing variations.

The above and other objects are achieved by providing a voltage detecting circuit which generates an output signal of a first magnitude when an input signal exceeds the power supply voltage by a predetermined amount. An output stage is provided for providing the output signal at an output node. A current source which provides a reference current is coupled to a control voltage portion which provides a first control voltage. The first control voltage is coupled to the output stage for establishing a sink current of the output stage which is proportional to the reference current. A current mirror is coupled to the output stage for providing a second control voltage in response to the voltage magnitude of the input signal relative to the reference level. The first and second control voltage, establish the voltage level of the output signal which is indicative of the level of the input signal. These and other objects, features and advantages will be more clearly understood from the following detailed description taken in conjunction with the accompanying drawing.

BRIEF DESCRIPTION OF THE DRAWING

The FIGURE is a schematic diagram of a circuit according to the present invention.

DESCRIPTION OF THE PRESENT INVENTION

The single FIGURE illustrates a circuit 10 according to the invention, which comprises an N-channel transistor 12 having a drain connected to a positive power supply voltage labeled $V_{DD}$. For the purpose of illustration only, assume that the value of $V_{DD}$ is chosen to be somewhere in the range of four to eight volts, such as five volts. A gate of transistor 12 is connected to an external pin 14 of the integrated circuit package in which circuit 10 is housed. A source and substrate of transistor 12 are connected to a node 16. Also connected to node 16 is a source of a P-channel transistor 18 which has a drain and a gate connected together at a node 20.

Additionally connected to node 20 is a drain of a P-channel transistor 22 which also has a source connected to $V_{DD}$. A gate of transistor 22 is connected to node 20, as is a drain of an N-channel transistor 24. A gate of transistor 24 is connected to a node 26, as are a drain and a gate of an N-channel transistor 28. Sources of transistors 24 and 28 are both connected to a voltage terminal such as ground, and a drain of transistor 28 is additionally connected to a current source 30. Current source 30 may be implemented, depending upon the accuracy or expected voltage tolerances of the environment in which the circuit is to operate, as a simple current source such as a conventional (P−) resistor or as a more complex and accurate current source. A feature of the present invention is that circuit 10 is substantially insensitive to current variations of current source 30 since the effects of such variations tend to be self-cancelling.

An output stage is provided comprising a P-channel transistor 32 which has a source connected to supply voltage $V_{DD}$ and a drain connected to an output node 34. A gate of transistor 32 is connected to node 20. Also connected to output node 34 is a drain of an N-channel transistor 36. A source of transistor 36 is connected to the ground voltage terminal, and a gate of transistor 36 is connected to node 26. While specific N-channel and P-channel MOS devices are shown, it should be obvious that circuit 10 may be implemented by completely reversing the processing techniques (e.g. P-channel to N-channel) or by using other types of transistors.

In operation, circuit 10 detects whether an input voltage on input pin 14 is significantly above the supply voltage potential $V_{DD}$ which is the highest voltage to which circuit 10 is subjected in normal operation. Until a high voltage input is detected, the output voltage at output node 34 remains at a logic high level. Detection of a high voltage input is designed to cause the logic level at output node 34 to change thereby forcing an integrated circuit, of which this circuit is a part, to assume a predetermined state, such as a test mode. Input pin 14 ordinarily is intended to perform a function other than as a test mode pin. Therefore, typically an operation voltage within a conventional CMOS voltage range, such as zero to five volts, is present at input pin 14. Such an operation voltage is coupled to other circuitry (not shown) connected to pin 14. Circuit 10 must therefore be insensitive to voltage signals at input pin 14 which are between for example zero and five volts, but must be activated by a voltage which is somewhat in excess of five volts to provide a margin for noise immunity or the like.

Constant current source 30 provides a current $I_1$ of predetermined magnitude through transistor 28. By proportioning the physical size of transistor 24 with transistor 28, a current $I_2$ proportional to current $I_1$, is mirrored through transistor 24. Transistor 36 is also sized proportional to transistors 24 and 28 and sinks a current $I_3$ which is proportional to currents $I_1$ and $I_2$. In one preferred form, each of transistors 24, 28 and 36 may be fabricated with the same length to width physical dimensions so that $I_1$, $I_2$ and $I_3$ are substantially equal.

Assuming input pin 14 receives an input voltage below $V_{DD}$ volts, transistor 22 which is configured as a diode sources a current substantially equal to $I_2$ via node 20 to transistor 24. Transistor 18 which is also configured as a diode is substantially nonconductive. In this example, the gate voltage of transistor 22 adjusts until the predetermined current $I_2$ is sourced by transistor 22. Transistor 22 then maintains the value of $I_2$ current.

The current through transistor 22 is mirrored to transistor 32 which sources current to output node 34 and transistor 36 partially in response to the level of input voltage at pin 14. In one form, transistor 32 may be sized with respect to transistor 22 such that the current sourced by transistor 32 from $V_{DD}$ is substantially equal to $2I_2$ or $2I_3$. In this form, transistor 32 is sized approximately twice as large as transistor 22. Transistor 32 initially sources a current substantially equal to $2I_3$ to node 34, and transistor 36 is limited by transistors 28 and 24 to conducting a current of magnitude $I_3$. Therefore, assuming node 34 is a high impedance output node, node 34 rises to a voltage approaching $V_{DD}$. The resulting source-to-drain voltage of transistor 32 unsaturates or forces transistor 32 to operate in a linear region of its current/voltage operating characteristics. The point of linear operation of transistor 32 is determined by the selection of the value of $I_3$ current which is mirrored by transistors 28 and 24 to transistor 36. When transistor 32 is unsaturated, transistor 32 is turned off sufficiently to reduce the current through transistor 32 to $I_3$. In practice, to achieve such a reduction in current the drain-to-source voltage, $V_{DS}$, of transistor 32 must be a few tenths of a volt. Thus the output taken at node 34 remains at a high logic level (a few tenths of a volt below $V_{DD}$) as long as the voltage on pin 14 remains below, at, or very slightly (less than one N-channel threshold drop) above $V_{DD}$.

Transistor 18 is also a mirror transistor and node 16 has a voltage potential which may vary or float but be within a few tenths of a volt of $V_{DD}$. Since the voltage at node 16 is near $V_{DD}$, no current flows through transistor 12 until the input pin voltage on the gate of transistor 12 is pulled enough above Vdd to make transistor 12 begin conducting. Thus the circuit 10 is not responsive at all to normal operating voltages applied to input pin 14. It should be readily apparent that the level of voltage required to make any current flow in transistor 12 may be established by controlling the size of transistor 12.

However, if the input voltage at input pin 14 and the gate of transistor 12 is increased well above $V_{DD}$, transistor 12 becomes very conductive thereby having a very small drain-to-source voltage. Current begins to flow through transistors 12 and 18. Since the drain-to-source voltage of transistor 12 is very small, the effect of the high input voltage is for transistors 18 and 22 to appear to operate in parallel and effectively be one large transistor. In one form, transistor 18 may be fabricated with physical width/length dimensions which are substantially three times the dimensions of transistor 22. Assuming the transistor dimensions for transistor 32 mentioned above, a current equal to substantially $(I_2)/2$ now flows through transistor 32 as a result of the current mirror configuration of transistors 18, 22 and 32. Thus the current available to transistor 36 is $(I_2)/2$. However, transistor 36 is attempting to sink $I_3$ (which is equal to $I_2$ in this example). The drain-to-source voltage of transistor 32 must drop until transistor 36 has become unsaturated and forced to operate at a current of $(I_2)/2$. This value of current is also chosen to be within a linear region of the voltage/current transfer curves of transistor 36. In practice, to achieve such a reduction in current, the drain-to-source voltage of transistor 36 must be a few tenths of a volt. Thus the output at node 34 becomes a low logic level which is equal to a few tenths of a volt above ground potential.

It can be seen that at some intermediate voltage on input pin 14, a current of magnitude $I_3$ will be mirrored out to transistor 32 by transistors 18 and 22. At this intermediate input voltage, the output at node 34 is indeterminate since this is the input voltage which corresponds to the switchpoint of the output node 34. However, if proper transistor sizes are chosen, the range of uncertainty for an input voltage is small. As a practical matter, current may begin to flow in transistor 12 when the input voltage reaches one N-channel threshold above $V_{DD}$. Therefore, to reach the switchpoint of circuit 10, the voltage applied to input pin 14 must be about one volt above that level, so positive switching may occur at about two volts above $V_{DD}$.

Because of the operating mechanism of circuit 10, in which current levels are relied upon to set the output voltage level, circuit 10 is insensitive to power supply variations since the generated current levels tend to be self balancing. Likewise, since in the mirroring circuits N-channel devices need not be matched with P-channel devices, and vice-versa, circuit 10 is relatively insensitive to processing variations.

While an embodiment has been disclosed using certain assumed parameters, such as a $V_{DD}$ of five volts and certain specified transistor proportions, it should be understood that certain obvious modifications to the circuit or the given parameters will become apparent to those skilled in the art, and the scope of the invention should be limited only by the scope of the claims appended hereto.

We claim:

1. A circuit for providing an output signal having a voltage level of a predetermined magnitiude in response to an input voltage having an absolute magnitude greater than an absolute magnitude of an reference voltage, comprising:
- a current source for providing a reference current;
- first means coupled to the current source for providing a first control voltage;
- second means, having a terminal adapted to receive the input voltage and providing a second control voltage in response to the magnitude of the input voltage relative to the reference voltage; and
- an output stage coupled to the first and second means, for providing the output signal in response to the first and second control voltages, said first control voltage establishing a sink current of the output stage proportional to the reference current, and said second control voltage establishing a first predetermined source current if the input voltage magnitude is greater than the reference voltage magnitude and establishing a second predetermined source current otherwise.

2. The circuit of claim 1 wherein the first means for providing the first control voltage to establish the sink current of the output stage is a current mirror.

3. The circuit of claim 1 wherein the output stage comprises;
- a first transistior of a first conductivity type having a first electrode coupled to a first reference voltage terminal, a control electrode for receiving the second control voltage, and a second current electrode for providing the output signal; and
- a second transistior of a second conductivity type having a first electrode coupled to the second electrode of the first transistor, a control electrode for receiving the first control voltage, and a second current electrode coupled to a second 4. The circuit of claim 1 wherein the second means further comprise:
- a first transistor of a first conductivity type having a first current electrode connected to a terminal for receiving the reference voltage, a control electrode for receiving the input voltage, and a second current electrode;
- a second transistor of a second conductivity type having a first current electrode connected to the second current electrode of the first transistor, and both a control electrode and a second current electrode connected together; and
- a third transistor of the second conductivity type having a first current electrode connected to the terminal for receiving the reference voltage, and both a control electrode and a second current electrode connected to the control electrode and the second current electrode of the second transistor, for providing the second control voltage.

5. A method for producing an output voltage of a predetermined magnitude in response to an input signal having an absolute magnitude greater than an absolute magnitude of a reference voltage, comprising the steps of:
- providing an output stage for providing the output voltage;
- providing a current source for providing a reference current;
- providing a first control voltage in response to the reference current;
- coupling the first control voltage to the output stage to establish a predetermined sink current of the output stage proportional to the reference current;
- providing a second control voltage having a magnitude proportional to the voltage magnitude of the input signal relative to the reference voltage; and
- coupling the second control voltage to the output stage to establish a first predetermined source current in the output stage if the input voltage magnitude is greater than the reference voltage magnitude and otherwise establishing a second predetermined source current in the output stage.

6. A circuit for producing a predetermined output signal of a first magnitude in response to an input voltage having an absolute value greater than an absolute value of a predetermined supply voltage, comprising:
- a current source for providing a reference current of a second magnitude;
- an output node formed by serially connecting current conducting electrodes of a first transistor and a second transistor, each of which is a current mirroring transistor;
- the first transistor sinking a first predetermined current from the output node having a first current magnitude proportional to the reference current;
- a current mirror connected to the second transistor, said second transistor providing a source current to the output node which maintains either a second current magnitude when the absolute value of the input signal is any value above the absolute value of the predetermined supply voltage or which maintains a third current magnitude when the absolute value of the input signal is any value equal to or less than the absolute value of the predetermined supply voltage.

* * * * *